United States Patent
Lok

(10) Patent No.: US 11,750,160 B1
(45) Date of Patent: Sep. 5, 2023

(54) GAIN-BOOSTED CLASS-AB DIFFERENTIAL RESIDUE AMPLIFIER IN A PIPELINED ANALOG-TO-DIGITAL CONVERTER (ADC) USING SWITCHED-CAPACITOR COMMON-MODE FEEDBACK TO ELIMINATE TAIL CURRENT SOURCES

(71) Applicant: Caelus Technologies Limited, Hong Kong (HK)

(72) Inventor: Chi Fung Lok, Hong Kong (HK)

(73) Assignee: Caelus Technologies Limited, Hong Kong (HK)

( * ) Notice: Subject to any disclaimer, the term of this patent is extended or adjusted under 35 U.S.C. 154(b) by 0 days.

(21) Appl. No.: 17/717,063

(22) Filed: Apr. 9, 2022

(51) Int. Cl.
*H03F 3/45* (2006.01)

(52) U.S. Cl.
CPC ..... *H03F 3/45125* (2013.01); *H03F 3/45197* (2013.01); *H03F 3/45488* (2013.01)

(58) Field of Classification Search
CPC .................................................. H03F 3/45125
See application file for complete search history.

(56) References Cited

U.S. PATENT DOCUMENTS

| | | | | |
|---|---|---|---|---|
| 5,442,318 A * | 8/1995 | Badyal | ............... | H03F 3/45192 330/253 |
| 5,530,444 A | 6/1996 | Tice et al. | | |
| 6,150,883 A * | 11/2000 | Ivanov | ................... | H03F 3/3028 330/253 |
| 8,937,508 B2 | 1/2015 | Cyrusian et al. | | |
| 9,219,492 B1 | 12/2015 | Lok et al. | | |
| 9,461,625 B1 * | 10/2016 | Prandi | .................. | H03H 19/004 |
| 10,374,554 B2 | 8/2019 | Karmaker et al. | | |
| 11,139,789 B1 * | 10/2021 | Kusuda | .................... | H03F 3/393 |
| 2002/0090034 A1 | 7/2002 | Lu | | |
| 2009/0027126 A1 * | 1/2009 | Singh | .................. | H03F 3/45188 330/261 |
| 2010/0073214 A1 * | 3/2010 | Kawahito | ........... | H03F 3/45237 330/255 |
| 2014/0009316 A1 | 1/2014 | Chou et al. | | |
| 2019/0158034 A1 * | 5/2019 | Sloboda | .................... | H03F 1/26 |
| 2021/0126647 A1 * | 4/2021 | Hsieh | .................... | H03M 1/183 |

* cited by examiner

*Primary Examiner* — Patricia T Nguyen
(74) *Attorney, Agent, or Firm* — gPatent LLC; Stuart T. Auvinen

(57) ABSTRACT

A differential residue amplifier fits between Analog-to-Digital Converter (ADC) stages. Switched-Capacitor Common-Mode Feedback circuits determine voltage shifts. An AC-coupled input network uses switched capacitors to shift upward voltages of the differential inputs to the residue amplifier to apply to an upper pair of p-channel differential transistors with sources connected to the power supply. The AC-coupled input network also shifts downward in voltage the differential inputs to the residue amplifier to apply to a lower pair of n-channel differential transistors with grounded sources. The drains of the p-channel differential transistors connect to differential outputs through p-channel cascode transistors. N-channel cascode transistors connect the drains of the n-channel differential transistors to the differential outputs. The drains of differential transistors can be input to differential amplifiers to drive the gates of the cascode transistors for gain boosting. No tail current is used, allowing for wider output-voltage swings with low supply voltages.

10 Claims, 12 Drawing Sheets

GAIN-BOOSTED CLASS-AB DIFFERENTIAL RESIDUE AMPLIFIER IN A PIPELINED ANALOG-TO-DIGITAL CONVERTER (ADC) USING SWITCHED-CAPACITOR COMMON-MODE FEEDBACK TO ELIMINATE TAIL CURRENT SOURCES

FIELD OF THE INVENTION

This invention relates to residue amplifiers, and more particularly to a low-voltage residue amplifier without a tail current source in Analog-to-Digital Converters (ADCs).

BACKGROUND OF THE INVENTION

Analog-to-Digital Converters (ADC) are widely used in many applications. Some applications require both high precision and high sampling speed. High precision can be achieved using multi-bit ADC's, such as 8-bits to 12-bits of precision.

FIG. 1 shows a capacitor array in an ADC. Converter 101 has a weighted array of capacitors 20, 26, 28 that share charge to the inputs to comparator 12 that generates a digital bit VCOMP that is 1 when the +input to comparator has a higher voltage than the—input.

A controller or sequencer (not shown) controls switches 16, 18 that allow various voltages to be switched to the outer or bottom plates of capacitors 20, 26, 28. Each switch can be individually controlled. A Successive-Approximation (SA) routine may be used to switch successively smaller capacitors on or off to test different digital values to see which digital value is closest to the analog input voltage.

For example, converter 101 may be initialized by setting all switches 16, 18 to connect a common-mode voltage VCM to the outer plates of all capacitors 20, 26, 28. The + and—input lines to comparator 12 may also be driven to VCM by equalizing switches (not shown). VCM can be generated as a midpoint between the reference voltages, such as (Vrefp+Vrefn)/2, using a 1:1 resistor divider.

Then in a sampling phase the true analog voltage AINP (Vinp) may be applied by switches 16, 18 to the outer plates of all capacitors 20, 26 that have inner (top) plates connected to the +input of comparator 12, while the complement analog voltage AINN (Vinn) is applied by switches 16, 18 to the outer plates of all capacitors 20, 28 that have inner plates connected to the—input of comparator 12. VCM is applied to both inputs of comparator 12. The differential analog input voltage is thus sampled into the plates of capacitors 20, 26, 28.

Next, during an evaluation phase switches 16, 18 drive VCM to all output plates, but a Successive-Approximation routine tests successively smaller capacitors that are driven with the reference voltage rather than with VCM.

For example, when the Most-Significant Bit (MSB) capacitors 26, 28 are being tested, upper switch 18 connects reference Vrefn to the outer plate of MSB capacitor 26, while lower switch 18 connects reference Vrefp to the outer plate of MSB capacitor 28. This switching causes charge sharing and charges to be shifted between MSB capacitors 26, 28 and the + and—input lines to comparator 12, which may flip the digital output VCOMP. The SA routine can watch VCOMP for the flip and set to clear bits in a Successive-Approximation-Register (SAR) as a result. By testing successively smaller capacitors 20, the SA routine can fill the SAR with a good approximation of the analog input voltage.

FIG. 2 shows a prior art multi-stage ADC with a residue amplifier. Rather than have a single converter 101 with many bits of resolution, multiple converters 106, 116 may be used in multiple stages. For example, rather than have a 12-bit single converter 101, first converter 106 may generate 5 bits (Most-Significant Bits, MSB), while second converter 116 generates another 8 bits (Least-Significant Bits, LSB).

Input voltage VIN is applied to first converter 106, which can have an array of capacitors and switches such as shown for converter 101 (FIG. 1). First converter 106 uses a SA routine to toggle switches until a final code is found and stored in a first SAR, SAR1 108.

Then the residual voltage, on the +input to comparator 12 in FIG. 1, is applied to the inverting (−) input of residue amplifier 22 and amplified to drive the analog voltage input to second converter 116. Like converter 101, second converter 116 has an array of capacitors and switches and uses a SA routine to toggle switches until a final code is found and stored in a second SAR, SAR2 118.

Feedback capacitor 104 feeds back the output of residue amplifier 22 to its inverting (−) input, while the non-inverting (+) input of residue amplifier 22 is connected to ground. The closed-loop gain is C1/C2 >1, where C1 is the capacitance of first converter 106 and C2 is the capacitance of feedback capacitor 104. C1 does not vary with the code in SAR1 108.

In actual circuits there is a small non-zero offset error in residue amplifier 22 that can be modeled by offset voltage 102 connected between the non-inverting (+) input of residue amplifier 22 and ground. This VOS error can be caused by mismatches in residue amplifier 22. Since VOS occurs within residue amplifier 22 or before the input to residue amplifier 22, this VOS error is amplified by the closed-loop gain of residue amplifier 22 and applied to the input to second converter 116. When this error is large, second converter 116 may not be able to correct this error.

The circuit design of residue amplifier 22 can increase the offset error VOS in residue amplifier 22. Poorly designed amplifiers can have mismatches that increase VOS. Amplifiers that are not symmetric or that have unbalanced or unmatched sides can increase offset error within residue amplifier 22. Fully differential rather than single-ended signals are often used to reduce offset.

FIG. 3 shows a prior-art amplifier. Residue amplifier 22' has tail current source 240 that sinks current from the sources of n-channel transistors 234, 236. Current mirror p-channel transistors 230, 232 have their gates connected together as mirrored current sources. Resistors 242, 244 are in series between the drains of transistors 230, 232, with a midpoint node between resistors 242, 244 that drives the gates of transistors 230, 232.

The drains of transistors 230, 234 connect together to drive the VOUTN output, while the drains of transistors 232, 236 connect together and drive the output VOUTP. VOUTP, VOUTN form a differential output, while VINP, VINN are the differential input.

The input VINP to differential amplifier 22' is applied to the gate of transistor 234 while the input VINN to differential amplifier 22' is applied to the gate of transistor 236. P-channel transistors 230, 232 can be long channel devices while n-channel transistors 234, 236 can be short channel, fast devices with good Gm. Resistors 242, 244 can be well-matched resistors, such as thin-film resistors.

While differential residue amplifier 22' is useful, tail current source 240 is needed to accurately define the bias current for the differential pair of n-channel transistors 234, 236. Tail current source 240 reduces the maximum possible output voltage swing. When a very low power supply voltage is used, such as 0.9 volt, the reduced output-voltage swing caused by tail current source 240 is significant and undesirable.

Any non-ideal factors in residue amplifier 22' may affect the accuracy of the overall pipeline-SAR ADC. Input referred noise of residue amplifier 22' should meet the noise floor requirement of the overall ADC for a high resolution ADC. This is one of the bottlenecks in amplifier design. The settling speed of residue amplifier 22' has to be fast enough for the high speed ADC. Low distortion is desired at the output of residue amplifier 22'. A moderate open-loop gain and a large signal swing are desirable. When the ADC converters operate with a low voltage core supply, then residue amplifier 22' should be able to work with the same low voltage core supply. The output-equivalent offset of residue amplifier 22' needs to be smaller than the allowable redundancy range of the ADC. Good phase margin for stable amplification or autozeroing phases is also desirable. Low power consumption is especially desirable, but can be the hardest to achieve, and can be a fundamental limitation.

What is desired is a differential residue amplifier that does not have a tail current source. A differential amplifier that operates with a low supply voltage yet has a wide output-voltage swing is desired. A high-gain, low voltage, wide swing differential amplifier is desired for use as a residue amplifier between stages in a high speed and high resolution pipeline ADC.

DETAILED DESCRIPTION

The present invention relates to an improvement in differential amplifiers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 4:
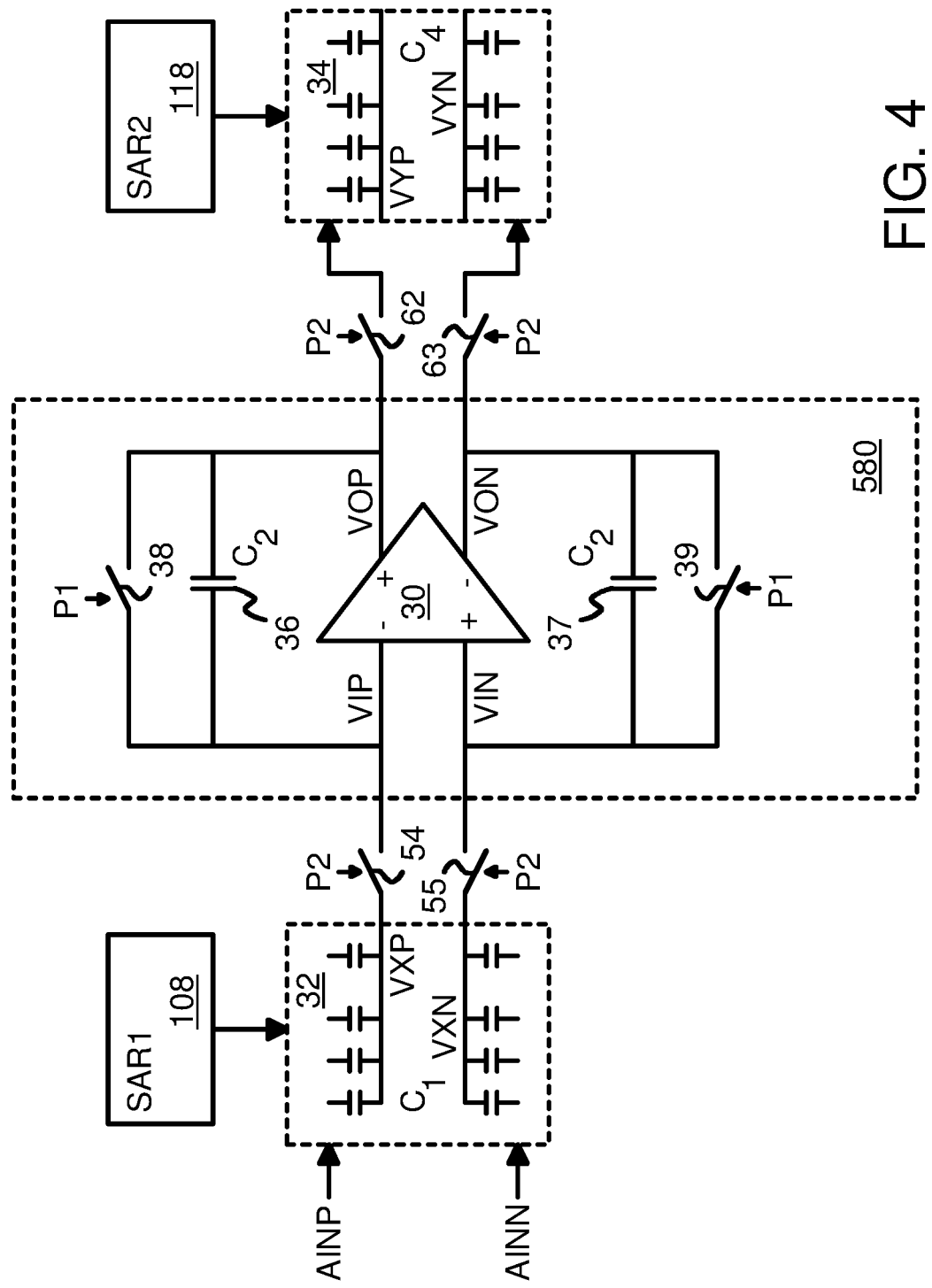
FIG. 4 shows a fully differential multi-stage pipelined ADC with the improved residue amplifier between stages.

FIG. 4 shows a fully differential multi-stage pipelined ADC with the improved residue amplifier between stages. A simple two-phase clock may be used to control operations. Phase P1 is the autozeroing phase for residue amplifier 30, while phase P2 is the amplify phase for residue amplifier 30.

During phase P1 first capacitor array 32 and second capacitor array 34 are used to convert analog to digital, and residue amplifier 30 is reset or autozeroed. During phase P2 residue amplifier 30 amplifies the residue output from first capacitor array 32 to drive an amplified residue into second capacitor array 34. First capacitor array 32 and second capacitor array 34 are reset, equalized, and/or sampled during phase P1.

A differential analog input AINP, AINN is applied to first capacitor array 32 that has capacitors switched by SAR1 108. AINP is switched to capacitors connected to VXP while AINN is switched to capacitors connected to VXN. During phase P1, a SA routine tests different bits of SAR1 108 that switch different capacitors in first capacitor array 32 until a best match digital value is found for the MSB's.

Switch 54 closes during phase P2 to connect VXP to VIP and the inverting (−) input of differential residue amplifier 30. Also, switch 55 closes during phase P2 to connect VXN to VIN and the non-inverting (+) input of differential residue amplifier 30. Feedback capacitor 36 connects the —input VIP and the +output VOP of residue amplifier 30, while feedback capacitor 37 connects the +input VIN and the— output VON of residue amplifier 30. Amplifier stage 580 includes feedback capacitors 36, 37 and switches 38, 39 that reset or zero residue amplifier 30 during phase P1.

Also during amplifying phase P2, switches 62, 63 close to connect VOP to AINP2, and to connect VON to AINN2. AINP2, AINN2 are the differential analog inputs to second capacitor array 34. AINP2 is switched to capacitors connected to VYP while AINN2 is switched to capacitors connected to VYN. During phase P1, a SA routine tests different bits of SAR2 118 that switch different capacitors in second capacitor array 34 until a best match digital value is found for the LSB's.

Figure 5:
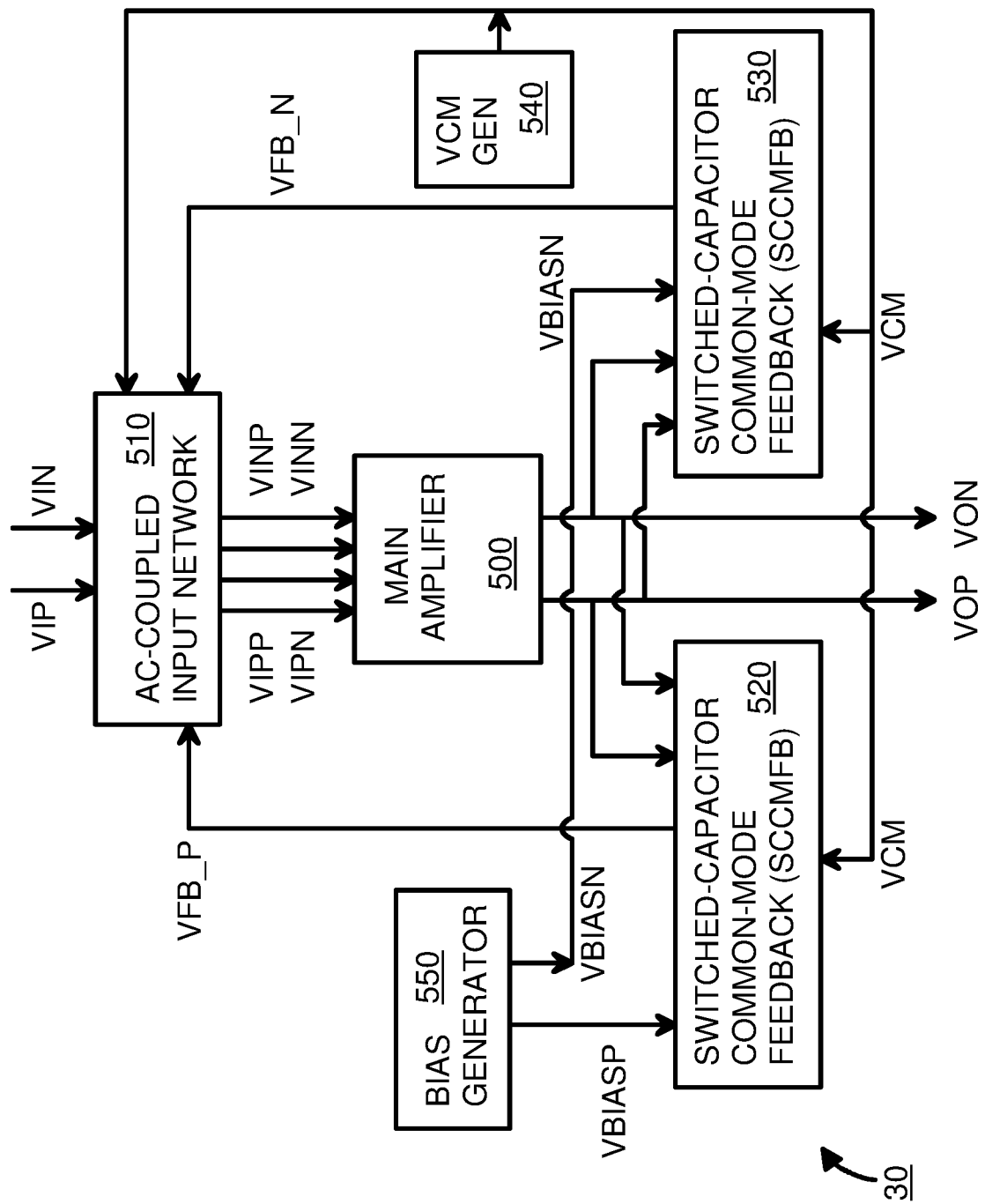
FIG. 5 is a block diagram of the improved residue amplifier.
Figure 6:
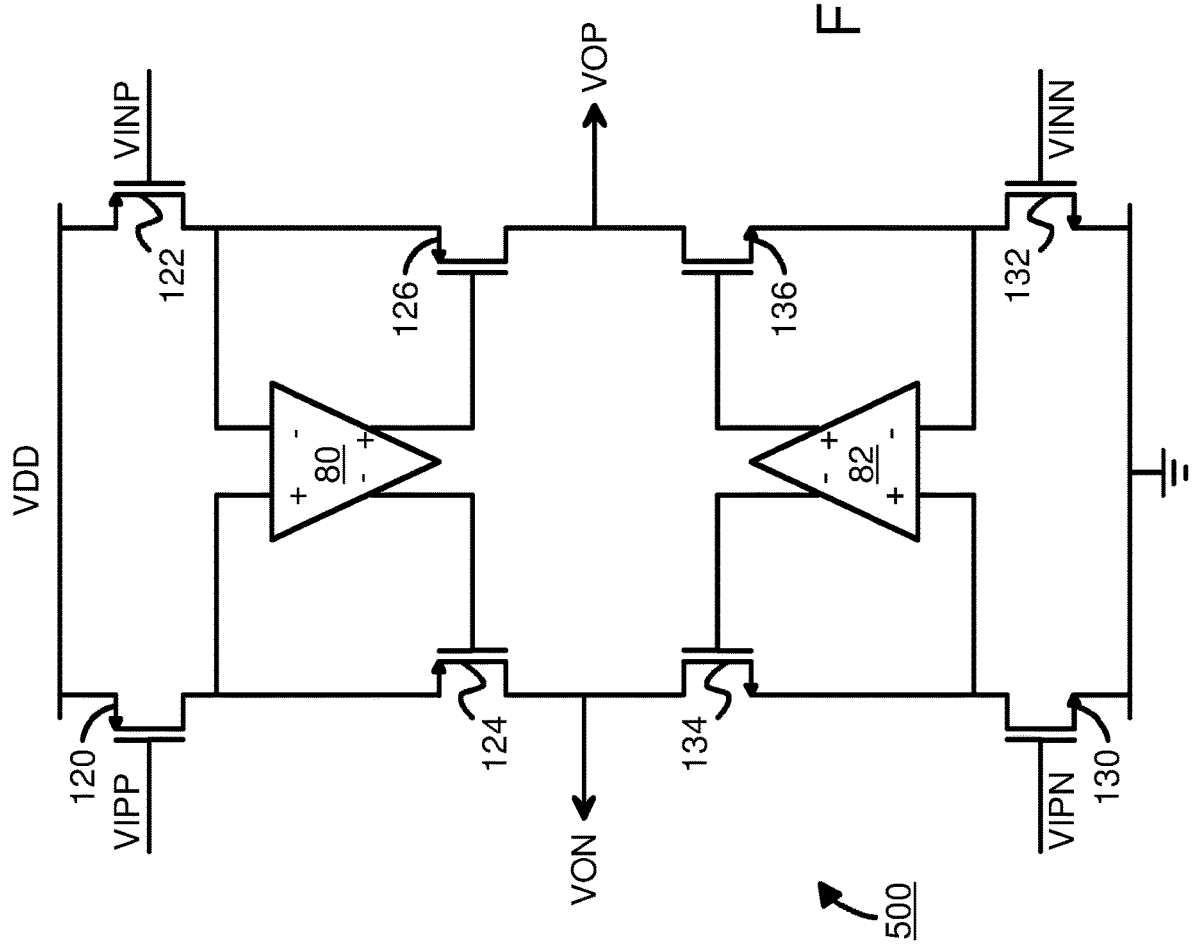
FIG. 6 is a schematic of the main amplifier without tail current sources.

FIG. 5 is a block diagram of the improved residue amplifier. Residue amplifier 30 has main amplifier 500 that does not have tail current sources, as shown in FIG. 6. Without a tail current source, main amplifier 500 can have both a p-channel differential pair of transistors and an n-channel differential pair of transistors for a wider output voltage swing on outputs VOP, VON.

AC-coupled input network 510 receives the analog differential inputs VIP, VIN to residue amplifier 30, and generates four inputs to main amplifier 500. Inputs VIPP, VIPN are generated from VIP, while inputs VINP, VINN are generated from input VIN. Capacitors in AC-coupled input network 510 provide AC coupling from the two inputs VIP, VIN to the four inputs VIPP, VIPN, VINP, VINN. These capacitors are switched to a common-mode voltage VCM, and to switched feedback voltages VFB_P, VFB_N during autozeroing phase P1 when residue amplifier 30 is autozeroed. AC-coupled input network 510 is shown in detail in FIG. 7.

Figure 10:
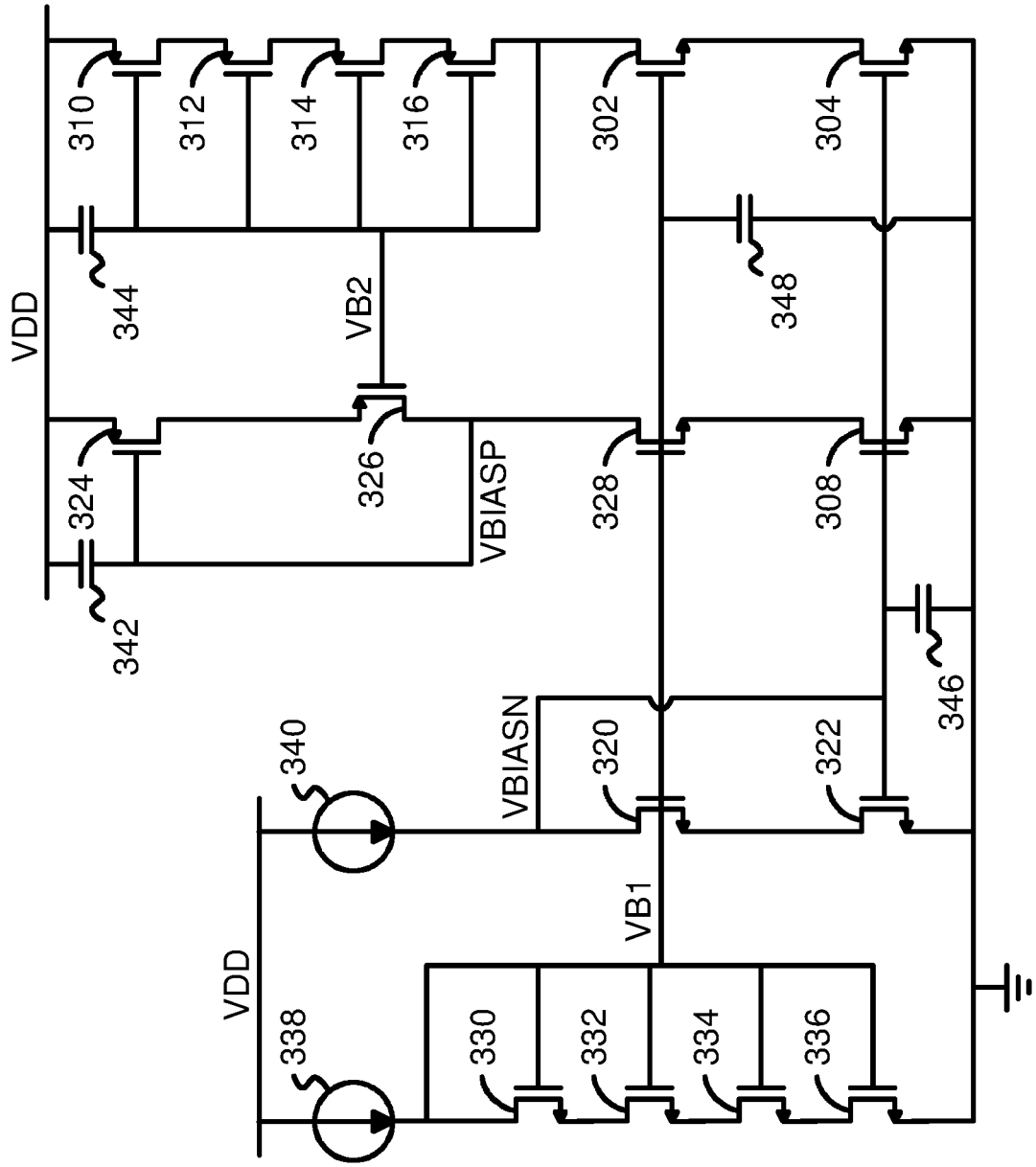
FIG. 10 is a schematic of the bias generator.

Bias generator 550 generates bias voltages VBIASP, VBIAS, such as by using the bias circuit shown in FIG. 10. Common-mode voltage generator 540 generates common-mode voltage VCM, such as by using the circuit of FIG. 11.

Figure 8:
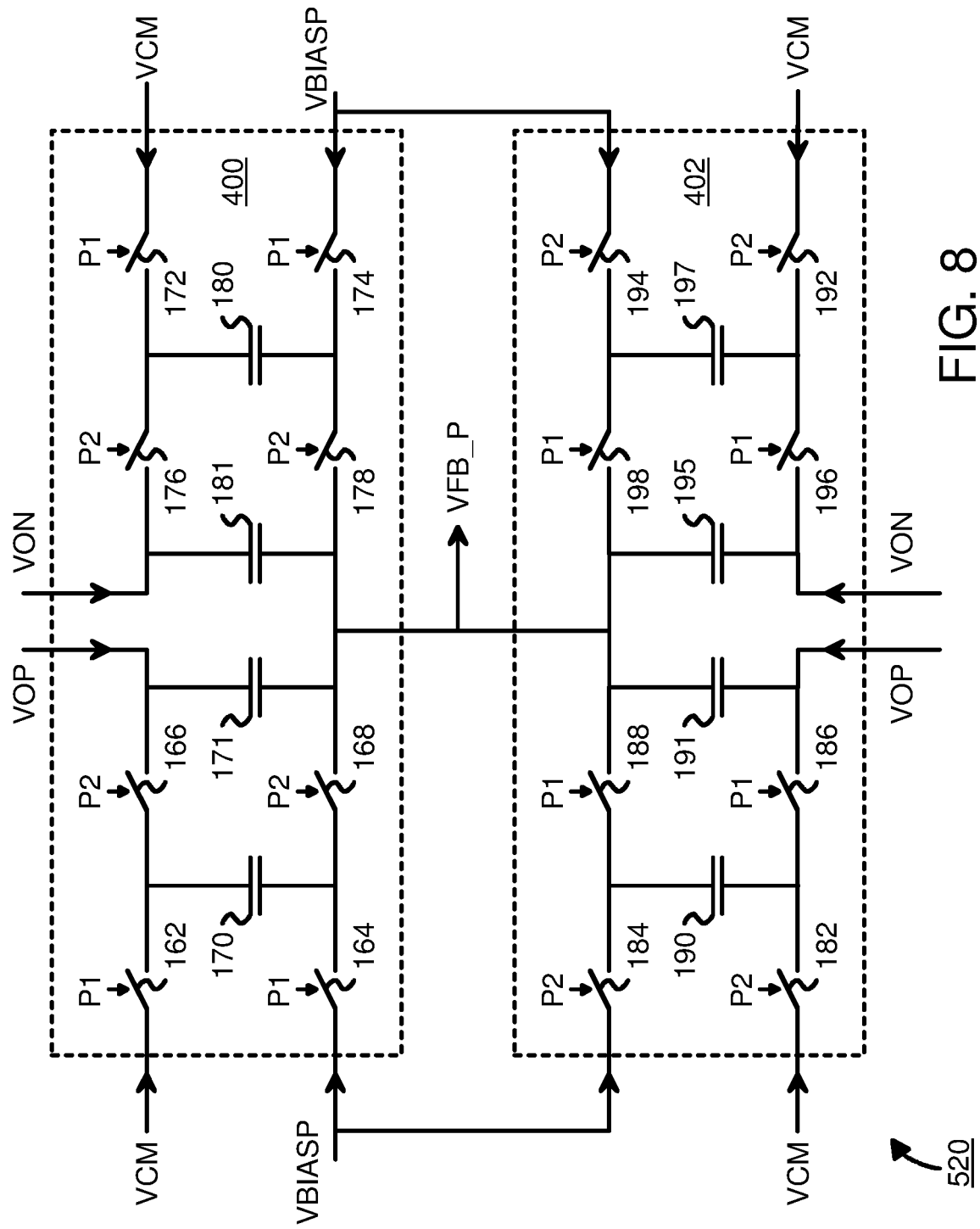
FIG. 8 is a schematic of the SCCMFB P circuit.
Figure 9:
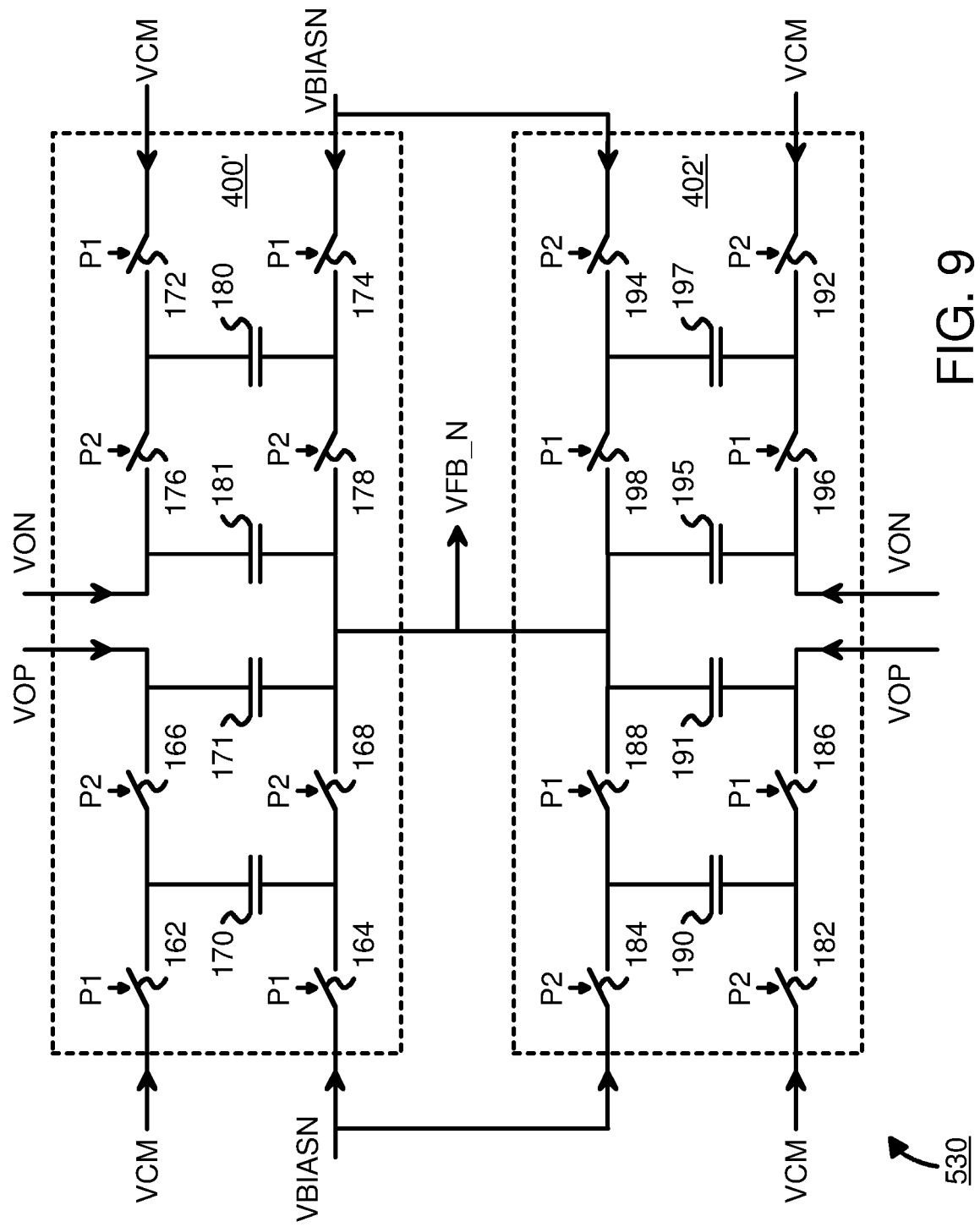
FIG. 9 is a schematic of the SCCMFB N circuit.

Switched-Capacitor Common-Mode Feedback (SCCMFB) P circuit 520 generates switched feedback voltage VFB_P from outputs VOP, VON, and from VCM and bias voltage VBIASP. SCCMFB circuit 520 uses switched capacitors in a ping-pong circuit and is shown in FIG. 8. Similarly, SCCMFB N circuit 530 generates switched feedback voltage VFB_N from outputs VOP, VON, and from VCM and bias voltage VBIASN, using switched capacitors in a ping-pong circuit as shown in FIG. 9.

AC-coupled input network 510 defines the proper common mode for the VIPP, VIPN, VINP, VINN inputs to main amplifier 500, according to bias generator 550 and SCCMFB P circuit 520, SCCMFB N circuit 530.

These defined voltages VIPP, VIPN, VINP, VINN allow differential pairs of transistors in main amplifier 500 to operate in the saturation region. There is one differential pair of p-channel transistors, and another differential pair of n-channel transistors within main amplifier 500.

FIG. 6 is a schematic of the main amplifier without tail current sources. Main amplifier 500 has two pairs of differential transistors. A first differential pair of p-channel differential transistors 120, 122 have gates receiving inputs VIPP, VINP, respectively, and have their sources connected to the VDD power supply. A second differential pair of n-channel differential transistors 130, 132 have gates receiving inputs VIPN, VINN, respectively, and have their sources connected to the ground supply. Differential transistors 120, 122, 130, 132 operate in the saturation region due to AC-coupled input network 510 coupling the VIP, VIN inputs to bias-adjusted common-mode voltages to generate the gate voltages of differential transistors 120, 122, 130, 132.

The current through main amplifier 500 can be ratioed to the bias current in bias generator 550. For example, p-channel differential transistors 120, 122 can have a size that is a multiple N of the size of p-channel bias transistor 324 (FIG. 10) in bias generator 550, while n-channel differential transistors 130, 132 can have a size that is a multiple N of the size of n-channel bias transistor 308 (FIG. 10).

Cascode transistors are inserted between the drains of differential transistors 120, 122, 130, 132 and outputs VOP, VON. These cascode transistors can have a longer gate length that increases gain in the amplifier without increasing the input-referred noise, power consumption, and delay of main amplifier 500.

In the upper half of the amplifier, current from the drain of p-channel differential transistor 120 passes through the channel of p-channel cascode transistor 124 to output VON. Current from the drain of p-channel differential transistor 122 passes through the channel of p-channel cascode transistor 126 to output VOP.

In the lower half of the amplifier, current from output VON passes through the channel of n-channel cascode transistor 134 to the drain of n-channel differential transistor 130. Current from output VOP passes through the channel of n-channel cascode transistor 136 to the drain of n-channel differential transistor 132.

Gain boosting is provided by differential amplifier 80, which receives the drain of p-channel differential transistor 120 at its non-inverting (+) input, and receives the drain of p-channel differential transistor 122 at its inverting (−) input, and amplifies the voltage difference on its inputs to generate its inverting (−) output that is applied to the gate of p-channel cascode transistor 124, and its non-inverting (+) output that is applied to the gate of p-channel cascode transistor 126.

Gain boosting is also provided in the lower half of main amplifier 500 by differential amplifier 82, which receives the drain of n-channel differential transistor 130 at its non-inverting (+) input, and receives the drain of n-channel differential transistor 132 at its inverting (−) input, and amplifies the voltage difference on its inputs to generate its inverting (−) output that is applied to the gate of n-channel cascode transistor 134, and its non-inverting (+) output that is applied to the gate of n-channel cascode transistor 136.

Since there is no tail current source, differential transistors 120, 122, 130, 132 can operate in the saturation region. The voltage headroom on differential transistors 120, 122, 130, 132 is $4*VDS_{(SAT)}$ where $VDS_{(SAT)}$ is the transistor saturated drain-to-source voltage. This voltage headroom can be around 500 mV. When using a 0.9-volt power supply VDD, main amplifier 500 can still allow a 250 mV peak-to-peak (Vpp) output-voltage swing. Total Harmonic Distortion (THD) can be better than −75 dBc.

Main amplifier 500 is formed with a cascode common source and has gain boosting that allows for a lowest possible circuit noise for residue amplifier 30, such as <400 $\mu V_{rms}$ a good phase margin (>60 degrees), and a moderate open loop gain (>60 dB typically).

High bandwidth is achieved using class AB push-pull differential transistors 120, 122, 130, 132 to provide a dual transconductance (dual Gm) to settle the amplified output signals VOP, VON during phase P2 without a tail current source. The class AB Push Pull PMOS/NMOS differential pairs of differential transistors 120, 122, 130, 132 allows for doubling the gain Gm for settling and open-loop gain for the same current bias N*IBIAS. Using push-pull differential transistors with cascode transistors allows circuit noise to be dominated by differential transistors 120, 122, 130, 132. The circuit can have an open loop gain of 60 dB without the need for a two-stage amplifier that may cause stability issues for settling. There are only 2 current legs in main amplifier 500, and main amplifier 500 can consume 90% of the power for the overall residue amplifier. Main amplifier 500 contains 2 PMOS and 2 NMOS differential transistors 120, 122, 130, 132 for rail-to-rail output swings. These transistors require only $4*VDS_{(SAT)}$ [e.g. 500 mV] which allows for high-swing outputs with a 0.9V VDD low-voltage power supply. Main amplifier 500 is symmetric, containing identical positive (p-channel) and negative (n-channel) circuits, which allows for good common mode rejection and matching (good HD2 performance).

Figure 7:
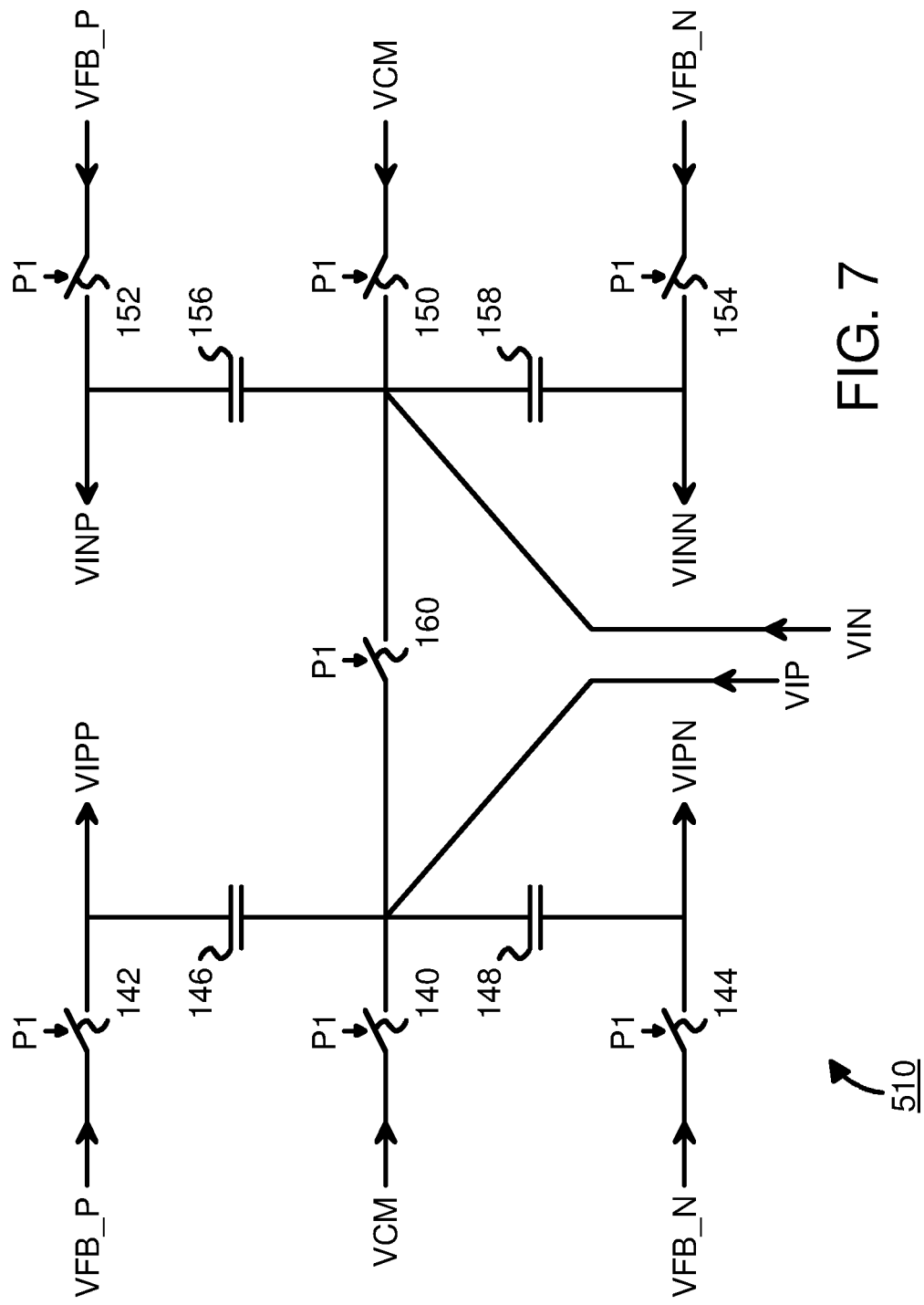
FIG. 7 is a schematic of the AC-coupled input network.

FIG. 7 is a schematic of the AC-coupled input network. AC-coupled input network 510 uses switched capacitors to shift the common mode voltages for the VIPP, VIPN, VINP, VINN inputs to main amplifier 500. This voltage shift allows differential transistors 120, 122, 130, 132 in main amplifier 500 to operate in the saturation mode.

AC-coupled input network 510 receives common-mode voltage VCM from common-mode voltage generator 540. AC-coupled input network 510 also receives an upward-adjusted common-mode-feedback voltage, VFB_P, from SCCMFB P circuit 520, and a downward-adjusted common-mode-feedback voltage, VFB_N, from SCCMFB N circuit 530.

Inputs VIP, VON are connected together by switch 160 during phase P1, when residue amplifier 30 is being auto-zeroed. All switches in AC-coupled input network 510 are closed during autozeroing phase P1 and opened during phase P2, when residue amplifier 30 is amplifying. Thus AC-coupled input network 510 loads capacitors 146, 148, 156, 158 during autozeroing phase P1. The voltage differences loaded onto capacitors 146, 148, 156, 158 during phase P1 are then applied to inputs VIP, VIN to shift their voltages during amplify phase P2.

Capacitor 146 is connected between input VIP and output VIPP. During phase P1 switches 142, 140 close to connect capacitor 146 between VFB_P and VCM. Capacitor 146 is thus precharged during phase P1 with VFB_P-VCM, which is applied to VIPP and to main amplifier 500 during amplify phase P2. Thus VIP is shifted up by VFB_P-VCM by AC-coupled input network 510.

Capacitor 148 is connected between input VIP and output VIPN. During phase P1 switches 140, 144 close to connect capacitor 148 between VCM and VFB_N. Capacitor 148 is thus precharged during phase P1 with VCM-VFB_N, which is applied to VIPN and to main amplifier 500 during amplify phase P2. Thus VIP is shifted down by VCM-VFB_N.

On the right half of AC-coupled input network 510, Capacitor 156 is connected between input VIN and output VINP. During phase P1 switches 152, 150 close to connect capacitor 156 between VFB_P and VCM. Capacitor 156 is thus precharged during phase P1 with VFB_P-VCM, which is applied to VINP and to main amplifier 500 during amplify phase P2. Thus VIN is shifted up by VFB_P-VCM by AC-coupled input network 510.

Capacitor 158 is connected between input VIN and output VINN. During phase P1 switches 150, 154 close to connect capacitor 158 between VCM and VFB_N. Capacitor 158 is thus precharged during phase P1 with VCM-VFB_N, which is applied to VINN and to main amplifier 500 during amplify phase P2. Thus VIN is shifted down by VCM-VFB_N by capacitor 158.

FIG. 8 is a schematic of the SCCMFB P circuit. SCCMFB P circuit 520 generates upward-adjusted common-mode-feedback voltage, VFB_P, that is applied to AC-coupled input network 510 to shift input VIP upward in voltage.

SCCMFB P circuit 520 receives as inputs common-mode voltage VCM and VBIASP from bias generator 550. VBIASP is a bias voltage that can be higher than VCM. SCCMFB P circuit 520 also receives outputs VOP, VON from main amplifier 500 and samples VOP onto capacitors 171, 191, and samples VON onto capacitors 181, 195. The other terminals of capacitors 171, 191, 181, 195 are connected together to output VFB_P. Thus VFB_P would be an averaged midpoint voltage of VOP-VON, but it is shifted upward in voltage by other components in SCCMFB P circuit 520. The upward voltage shift is ideally a function of VBIASP-VCM.

During phase P1, switches 162, 164 close to apply VCM and VBIASP to the terminals of capacitor 170. Then in phase P2, switches 166, 168 close to transfer charge from capacitor 170 to capacitor 171. A portion of the VBIASP-VCM voltage difference stored on capacitor 170 is applied to capacitor 171 to be added to VOP when capacitor 171 generates VFB_P. The amount of the voltage difference VBIASP-VCM that is transferred depends on the ratio of capacitances of capacitors 170, 171.

Similarly, during phase P1, switches 172, 174 close to apply VCM and VBIASP to the terminals of capacitor 180. Then in phase P2, switches 176, 178 close to transfer charge from capacitor 180 to capacitor 181. A portion of the VBIASP-VCM voltage difference stored on capacitor 180 is applied to capacitor 181 to be added to VON when capacitor 181 generates VFB_P.

Ping circuit 400 includes capacitors 170, 171, 180, 181 and switches 162-168, 172-178 which drives capacitors 171, 181 during phase P2. Pong circuit 402 is identical to ping circuit 400, but has opposite clocking. During phase P2 switches 182, 184, 192, 194 close to precharge capacitors 190, 197 with VBIASP-VCM. Then in phase P1 switches 186, 188, 196, 198 close to share charge to capacitors 191, 195.

Thus ping circuit 400 loads capacitors 171, 181 during phase P2, while pong circuit 402 loads capacitors 191, 195 during phase P1. Capacitors 171, 191, 181, 195 are alternately charged in a ping-pong fashion by ping circuit 400 and pong circuit 402. This ping-pong action provides a more stable output for VFB_P.

FIG. 9 is a schematic of the SCCMFB N circuit. SCCMFB N circuit 530 generates downward-adjusted common-mode-feedback voltage, VFB_N, that is applied to AC-coupled input network 510 to shift input VIN downward in voltage.

SCCMFB N circuit 530 has the same structure and operation as SCCMFB P circuit 520, but receives VBIASN which can be than VCM, and generates VFB_N, which also can be lower than VCM.

Ping circuit 400' receives VCM and VBIASN and adjusts VOP downward by a portion of VCM-VBIASN to generate a stable VFB_N during phase P1. Pong circuit 402' also receives VCM and VBIASN and adjusts VOP downward by a portion of VCM-VBIASN to generate a stable VFB_N during phase P2.

SCCMFB P circuit 520 and SCCMFB N circuit 530 help define the proper output common mode of main amplifier 500 to be a constant VCM to properly bias differential transistors 120, 122, 130, 132. No tail current source is required as is common in the prior art. A maximum output swing is provided by main amplifier 500 with a moderate open-loop gain for residue amplifier 30.

Ping circuit 400 and pong circuit 402 work together to provide a well-defined output common mode voltage that is constant and stable. The bias current and gain Gm for the two phases P1, P2 is also stable and constant.

FIG. 10 is a schematic of the bias generator. Bias generator 550 generates bias voltages VBIASP and VBIASN from power-supply voltage VDD and ground.

Current source 338 drives current through n-channel transistors 330, 332, 334, 336 in series to ground, which have their gates connected together and to the drain of upper n-channel transistor 330 to generate VB1. VB1 drives the gates of n-channel transistors 320, 328, 302 in other legs. Capacitor 348 filters voltage VB1.

In the second leg, current source 340 drives current from VDD into the drain of n-channel transistor 320, which is in series with n-channel transistor 322 to ground. The drain of n-channel transistor 320 generates lower bias voltage VBIASN, which is filtered by capacitor 346 to ground. VBIASN is applied to the gates of n-channel transistors 322, 308, 304.

In the fourth leg, p-channel transistors 310, 312, 314, 316 are in series and have their gates connected together and to the drain of lower p-channel transistor 316 to generate VB2. Capacitor 344 to VDD filters voltage VB2. The drain of lower p-channel transistor 316 connects to the drain of n-channel transistor 302, which is in series with n-channel transistor 304 to ground.

In the third leg, p-channel transistors 324, 326 and n-channel transistors 328, 308 are in series between VDD and ground. The drains of p-channel transistor 326 and n-channel transistor 328 are connected together to drive upper bias voltage VBIASP, which is filtered by capacitor 342 and drives the gate of upper p-channel transistor 324. The gate of lower p-channel transistor 326 is driven by VB2.

Figure 11:
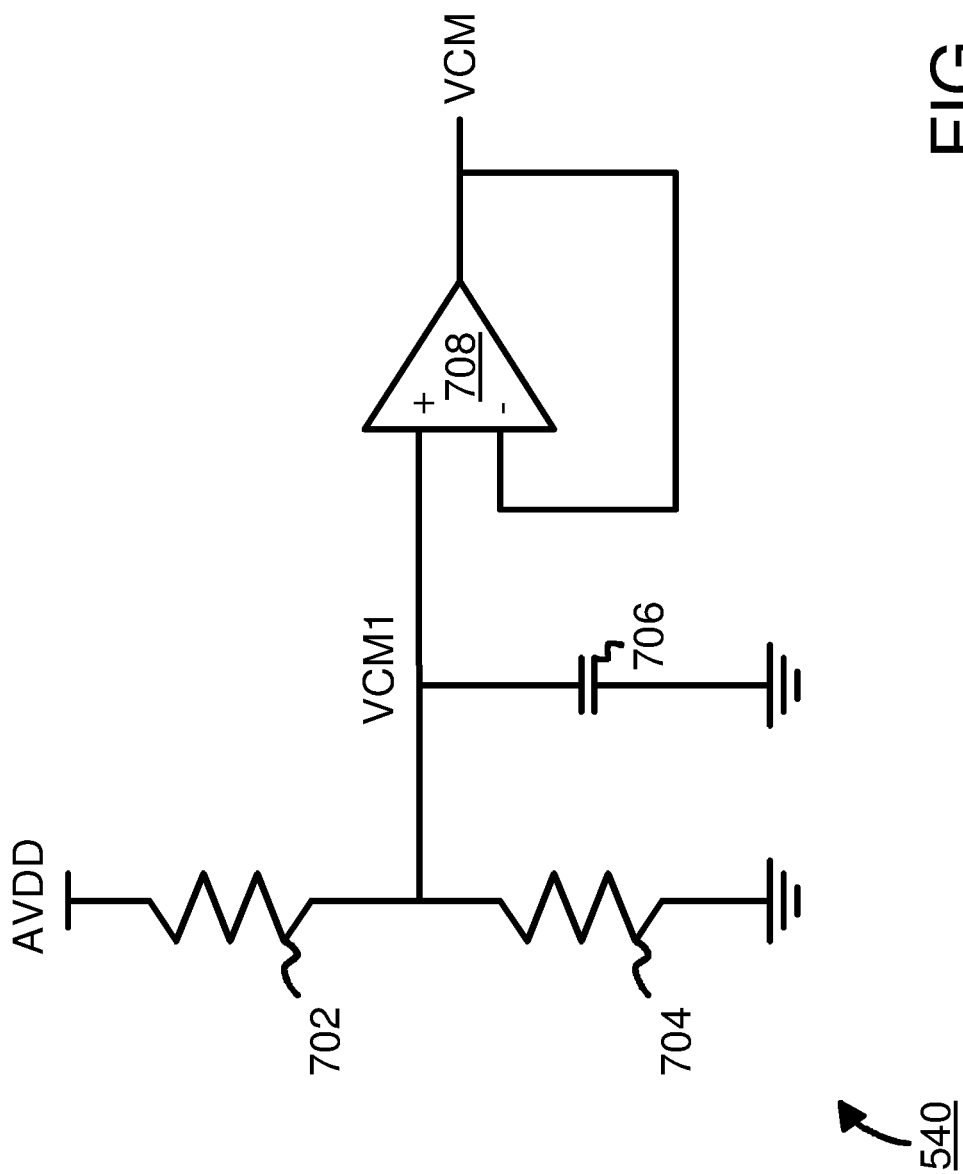
FIG. 11 is a schematic of the common-mode voltage generator.

FIG. 11 is a schematic of the common-mode voltage generator. Common-mode voltage generator 540 has resistors 702, 704 in series between an analog power supply AVDD and ground to generate VCM1 that is filtered by capacitor 706 to ground. Resistors 702, 704 can have equal resistances for VCM=AVDD/2. Op amp 708 receives VCM1 on its non-inverting (+) input and has its output fed back to its inverting input (−) to generate the common-mode voltage VCM. Op amp 708 can be large enough to keep VCM stable when many devices connect to VCM and VCM has a large load.

Figure 12:
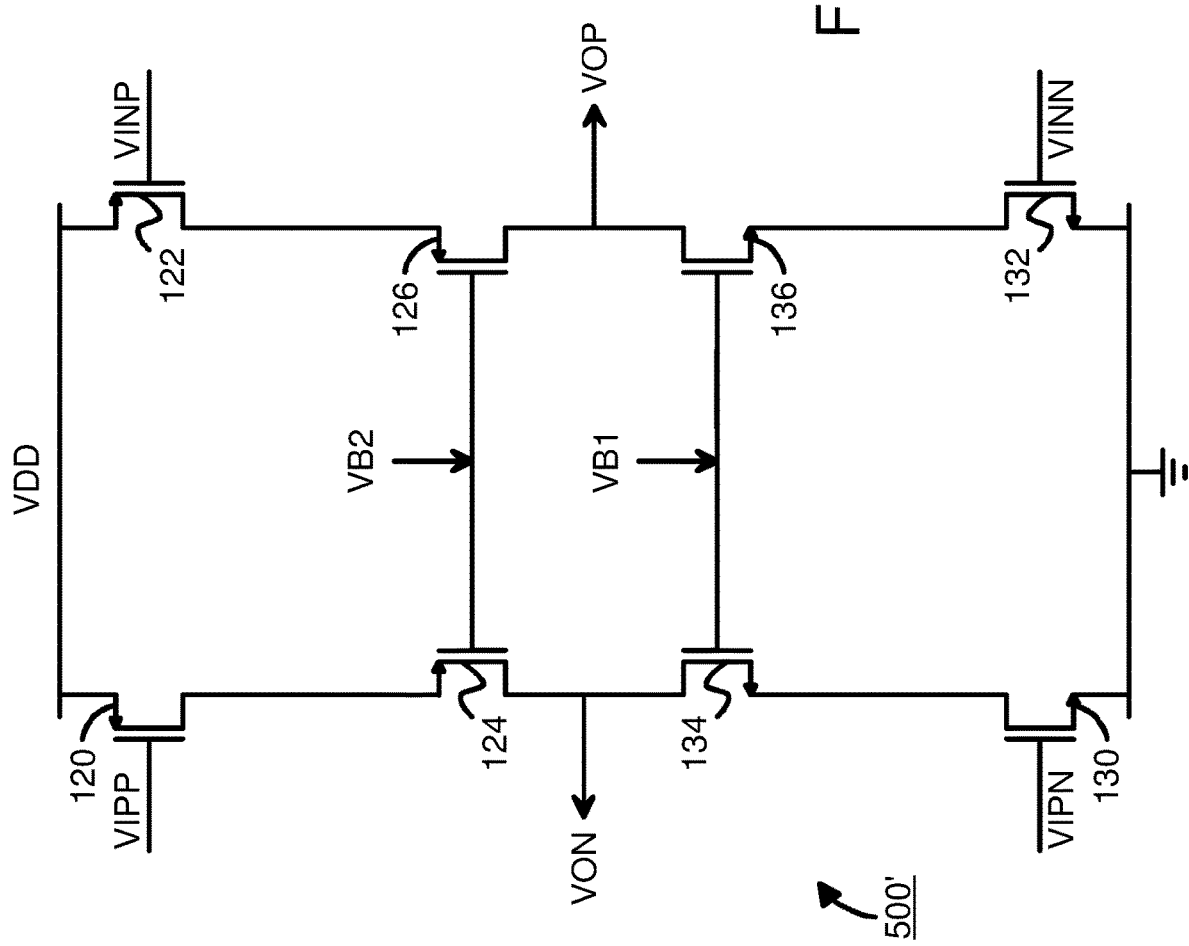
FIG. 12 is a cascode-only embodiment of the main amplifier.

FIG. 12 is a cascode-only embodiment of the main amplifier. Main amplifier 500 (FIG. 6) has differential amplifiers 80, 82 that provide gain boosting but draw additional power. Cascode-only main amplifier 500' eliminates differential amplifiers 80, 82. The gates of p-channel cascode transistors 124, 126 are driven by bias voltage VB2 from bias generator 550 (FIG. 10), while the gates of n-channel cascode transistors 134, 136 are driven by bias voltage VB1.

Power and area are saved by using cascode-only main amplifier 500'. Some applications may not require gain boosting and can have a more moderate open-loop gain for residue amplifier 30.

Alternate Embodiments

Several other embodiments are contemplated by the inventor. For example level shifters may be added, such as between the core reference buffer and the multiple ADC channels. The voltage levels assigned to power and ground may be shifted, so that the common-mode or middle of the supply range is defined as ground with a positive and a negative supply terminals, where the negative supply terminal is the old ground.

Many circuit implementations and variations are possible. For example, a different number of transistors in series could be used in bias generator 550 for different values of VDD and different processes and environments. Many variations are possible in bias generator 550, common-mode voltage generator 540, and other circuits. The size or ratio of sizes of components may be adjusted for different power requirements or for other reasons.

Capacitance ratios of capacitors in AC-coupled input network 510, SCCMFB P circuit 520, and SCCMFB N circuit 530 could be adjusted to vary filtering and charge sharing or other parameters. Other kinds of voltage-shifters or level-shifters could be substituted for the capacitor AC level shifters of AC-coupled input network 510, SCCMFB P circuit 520, and SCCMFB N circuit 530. Capacitors behave ideally at high frequencies, but at lower frequency operation there may be greater losses across capacitors and less efficient voltage shifting in AC-coupled input network 510, SCCMFB P circuit 520, and SCCMFB N circuit 530. Thus the design using AC voltage shifting through capacitors is best used for high-frequency ADC's and not in static or very low frequency ADCs.

Equalizing could be performed by a switch connecting P and N lines together, or by multiple switches connecting the P and N line to a fixed voltage, such as ground or VCM. Switch 41 between VOP, VON could also have additional switches to VCM, as one example.

Rather than have common-mode voltage generator 540 generate VCM from AVDD, it could generate VCM from VDD, or from VOP, VON. Various simplifications could be made, such as deleting common-mode voltage generator 540 and instead have SCCMFB P circuit 520 or SCCMFB N circuit 530 generate VCM from VOP, VON. SCCMFB P circuit 520 and SCCMFB N circuit 530 could be deleted when feedback is not needed. VIBASP could be applied as VFB_P to AC-coupled input network 510, and VBIASN or another bias could be applied to AC-coupled input network 510 as VFB_N. Rather than have both ping circuit 400 and pong circuit 402, redundancy could be eliminated by having only ping circuit 400 and a capacitor for filtering.

While VBIASP can be above common-mode voltage VCM and VBIASN can be below VCM, this is not required. Some advanced processes with very low power-supply voltages may have VBIASN above VCM, as one example.

Many variations of the ADC stages are possible. The analog inputs AINP, AINN to first capacitor array 32 may connect to AINP, AINN, respectively, of FIG. 1, and the outputs of switches 62, 63 may connect to AINP, AINN, respectively, of another instance of the circuit of FIG. 1 that implement second capacitor array 34. The inputs to comparator 12 of FIG. 1 can be combining nodes VXP, VXN for first capacitor array 32 and VYP, VYN for second capacitor array 34. This is sometimes referred to as bottom plate sampling.

Figure 1:
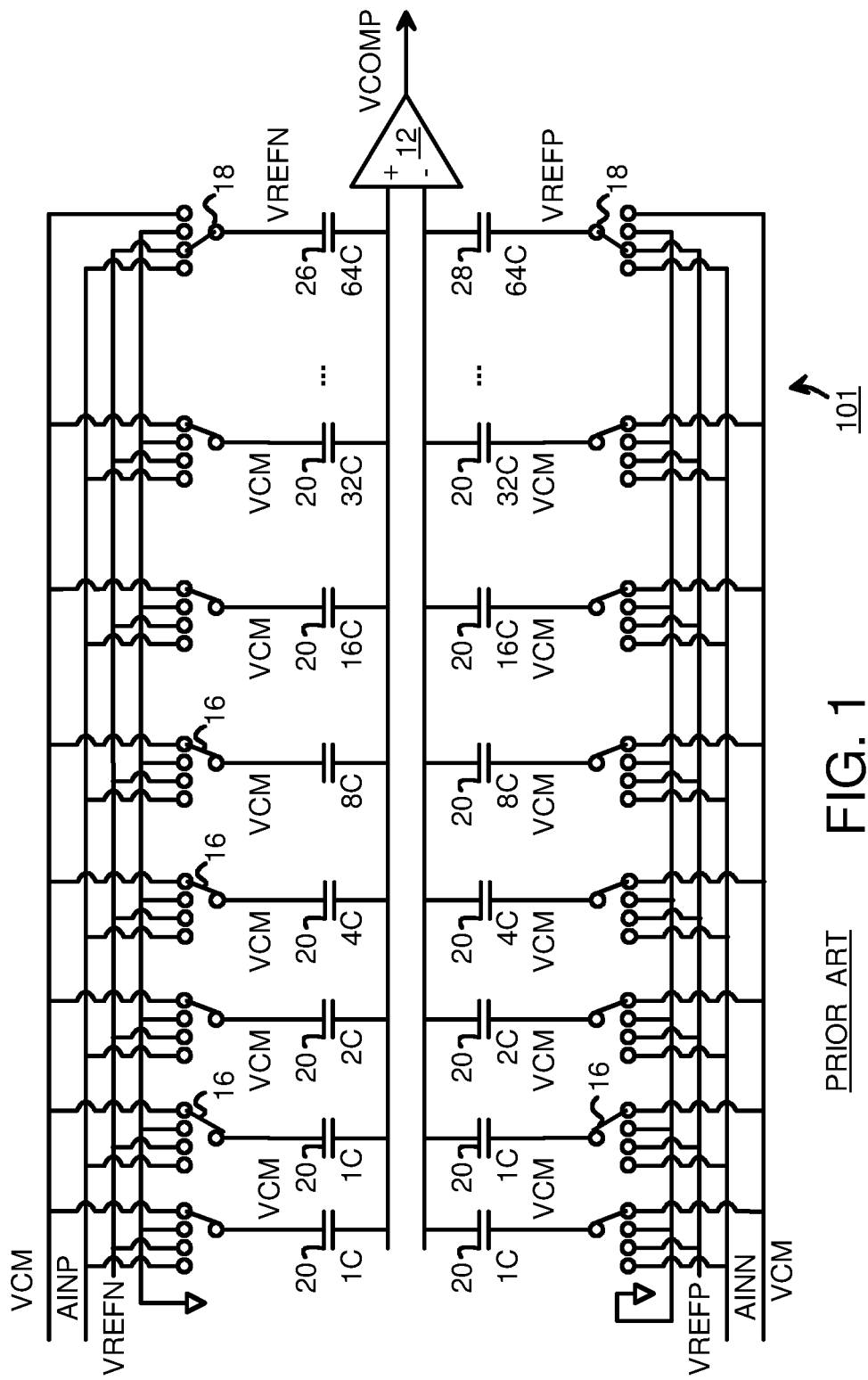
FIG. 1 shows a capacitor array in an ADC.
Figure 2:
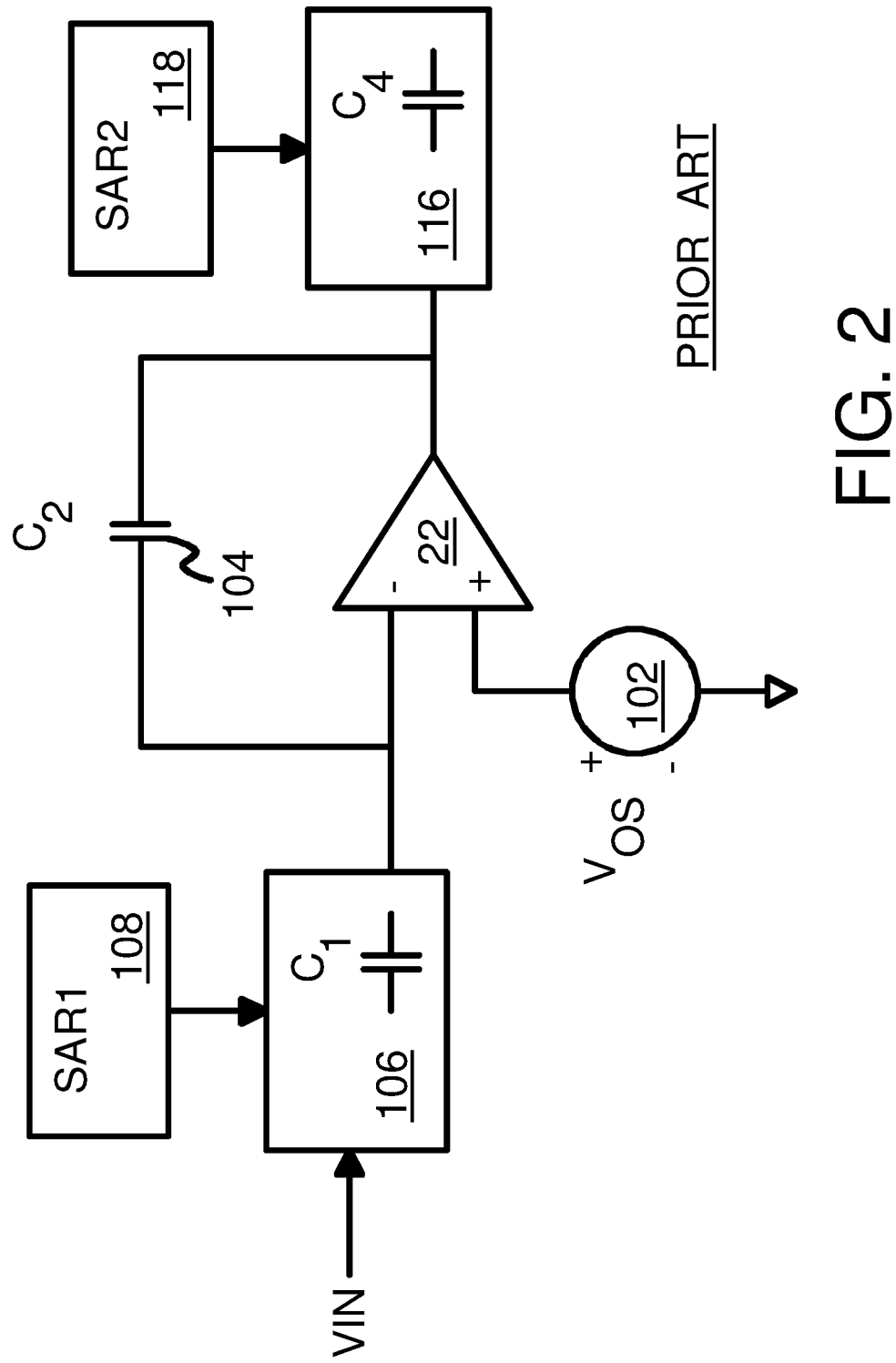
FIG. 2 shows a prior art multi-stage ADC with a residue amplifier.
Figure 3:
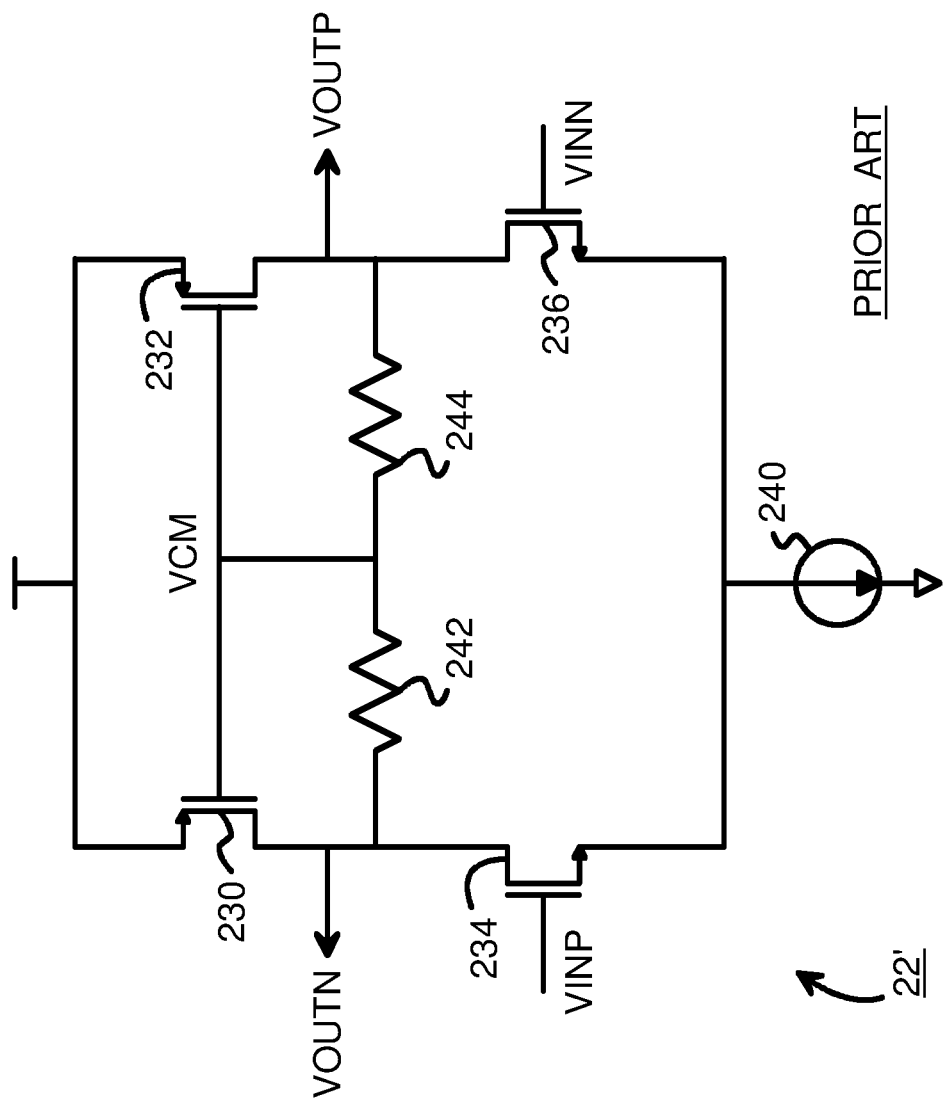
FIG. 3 shows a prior-art amplifier.

Another alternative is top plate sampling, wherein the analog inputs AINP, AINN to first capacitor array 32 may connect to combining nodes VXP, VXN to comparator 12 (FIG. 1). The circuit of FIG. 1 is changed to have AINP or VINP switched to VXP to the upper input of comparator 12, and to have AINN or VINN switched to VXN to the lower input of comparator 12. Signal loss can be reduced with top plate sampling, but additional calibration may be needed. Other variations are possible.

While switched-capacitor SAR ADC stages have been shown, flash-ADC stages may be substituted for a pipeline-flash ADC. A hybrid ADC may have a flash ADC for one stage, and a SAR-ADC for the other stage. While first capacitor array 32 with a 5-bit resolution and second capacitor array 34 with an 8-bit resolution have been described, other resolutions may be substituted, such as 3-bit/5-bit, 7-bit/10-bit, etc. Various redundancy and calibration may be implemented.

While two stages with SAR1 108, first capacitor array 32, and SAR2 118, second capacitor array 34, have been shown, more stages could be added, such as by having second capacitor array 34 output its residue voltage to another residue amplifier 30, which then drives a third capacitor array that is converted by a third SAR.

Terms such as top, bottom, up, down, upper, lower, etc. are relative and are not meant to be limiting. Inversions may be added, such as by swapping + and − inputs or outputs, or by adding inverters. While a simple two-phase clocking scheme has been described, with phase P1 and phase P2, more complex clocking may be substituted, and three, four, or more phases may be used. Clock signals may be delayed to some switches. Timing skews may be added. Additional equalizing or biasing switches may be added, such as between VIN, VIP. While analog voltages have been described, analog currents could also be converted and the residue could be a residue current.

While n-channel Metal-Oxide-Semiconductor Field-Effect Transistors (MOSFETs) and p-channel transistors have been described, other kinds of transistors that can be substituted, such as bipolar NPN, PNP, Fin Field-Effect Transistor (FinFET), or Junction FET (JFET).

Current sources could be approximated or implemented as transistors having gate and drains connected together, or depletion mode transistors or native transistors. Self-biasing or bandgap reference voltages may be used.

Additional components may be added at various nodes, such as resistors, capacitors, inductors, transistors, etc., and parasitic components may also be present. Enabling and disabling the circuit could be accomplished with additional transistors or in other ways. Pass-gate transistors or transmission gates could be added for isolation. Inversions may be added, or extra buffering. Capacitors may be connected together in parallel to create larger capacitors that have the same fringing or perimeter effects across several capacitor sizes. Switches could be n-channel transistors, p-channel transistors, or transmission gates with parallel n-channel and p-channel transistors, or more complex circuits, either passive or active, amplifying or non-amplifying. Switches could use boosted gate voltages for lower ON resistance, where the high gate voltage is boosted above VDD.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A residue amplifier comprising:
a differential input having a true input and a complement input;
an input shifter, receiving the differential input, for generating an upper differential input and a lower differential input, the input shifter shifting upward in voltage the differential input to generate the upper differential input, the input shifter shifting downward in voltage the differential input to generate the lower differential input;
a true p-channel differential transistor having a gate receiving a true input of the upper differential input, and having a source connected to a power supply and a drain connected to a true upper node;
a complement p-channel differential transistor having a gate receiving a complement input of the upper differential input, and having a source connected to the power supply and a drain connected to a complement upper node;
a true p-channel cascode transistor having a source connected to the true upper node, and a drain connected to a complement output node;
a complement p-channel cascode transistor having a source connected to the complement upper node, and a drain connected to a true output node;
a true n-channel differential transistor having a gate receiving a true input of the lower differential input, and having a source connected to a ground and a drain connected to a true lower node;
a complement n-channel differential transistor having a gate receiving a complement input of the lower differential input, and having a source connected to the ground and a drain connected to a complement lower node;
a true n-channel cascode transistor having a source connected to the true lower node, and a drain connected to the complement output node;
a complement n-channel cascode transistor having a source connected to the complement lower node, and a drain connected to the true output node;
wherein the true output node and the complement output node form a differential output;
an upper differential amplifier having a first input connected to the true upper node and having a second input connected to the complement upper node, the upper differential amplifier generating a first output driving a gate of the complement p-channel cascode transistor, and generating a second output driving a gate of the true p-channel cascode transistor;
a lower differential amplifier having a first input connected to the true lower node and having a second input connected to the complement lower node, the lower differential amplifier generating a first output driving a gate of the complement n-channel cascode transistor, and generating a second output driving a gate of the true n-channel cascode transistor;
wherein gain boosting is provided;
wherein the input shifter comprises an AC-coupled input network that comprises;
a true upper capacitor connected between the true input of the differential input and the true input of the upper differential input;
a true upper switch that closes to connect an upper shift voltage to the true upper capacitor during a zeroing phase of the residue amplifier;
a complement upper capacitor connected between the complement input of the differential input and the complement input of the upper differential input;
a complement upper switch that closes to connect the upper shift voltage to the complement upper capacitor during the zeroing phase of the residue amplifier;
a true lower capacitor connected between the true input of the differential input and the true input of the lower differential input;
a true lower switch that closes to connect a lower shift voltage to the true lower capacitor during the zeroing phase of the residue amplifier;
a complement lower capacitor connected between the complement input of the differential input and the complement input of the lower differential input;
a complement lower switch that closes to connect the lower shift voltage to the complement lower capacitor during the zeroing phase of the residue amplifier;
wherein the upper shift voltage is higher in voltage than the lower shift voltage;

an upper Switched-Capacitor Common-Mode Feedback (SCCMFB) circuit that comprises:
an upper first true capacitor connected between the true output node and the upper shift voltages;
an upper first true staging capacitor;
upper first true switches that connect the upper first true staging capacitor to the upper first true capacitor during a second phase and that load the upper first true staging capacitor with an upper bias voltage during a first phase;
an upper first complement capacitor connected between the complement output node and the upper shift voltage;
an upper first complement staging capacitor; and
upper first complement switches that connect the upper first complement staging capacitor to the upper first complement capacitor during the second phase and that load the upper first complement staging capacitor with the upper bias voltage during the first phase.

2. The residue amplifier of claim 1 further comprising:
an input equalizing switch that closes to connect the true input of the differential input to the complement input of the differential input during the zeroing phase of the residue amplifier.

3. The residue amplifier of claim 1 wherein the upper SCCMFB circuit further comprises:
an upper second true capacitor connected between the true output node and the upper shift voltage;
an upper second true staging capacitor;
upper second true switches that connect the upper second true staging capacitor to the upper second true capacitor during the first phase and that load the upper second true staging capacitor with the upper bias voltage during the second phase;
an upper second complement capacitor connected between the complement output node and the upper shift voltage;
an upper second complement staging capacitor;
upper second complement switches that connect the upper second complement staging capacitor to the upper second complement capacitor during the first phase and that load the upper second complement staging capacitor with the upper bias voltage during the second phase.

4. The residue amplifier of claim 3 wherein the upper first true switches further comprise:
a first load switch that connects a first terminal of the upper first true staging capacitor with a common-mode voltage during the first phase;
a second load switch that connects a second terminal of the upper first true staging capacitor with the upper bias voltage during the first phase;
a third load switch that connects the first terminal of the upper first true staging capacitor with a first terminal of the upper first true capacitor connected to the true output node during the second phase;
a fourth load switch that connects the second terminal of the upper first true staging capacitor with the second terminal of the upper first true capacitor connected to the upper shift voltage during the second phase.

5. The residue amplifier of claim 3 further comprising:
a lower SCCMFB circuit that is a replica of the upper SCCMFB circuit with the lower shift voltage replacing the upper shift voltage and a lower bias voltage replacing the upper bias voltage;
wherein the lower bias voltage is less than the upper bias voltage.

6. A differential residue amplifier comprising:
a differential input having a VIP input and a VIN input wherein VIP and VIN are complementary;
a voltage shifter, receiving the differential input, for generating an upper differential input having a VIPN input and a VIPP input, and for generating a lower differential input having a VINP input and a VINN input, the voltage shifter shifting upward a common-mode voltage of the differential input to generate the upper differential input, the voltage shifter shifting downward the common-mode voltage of the differential input to generate the lower differential input;
a true p-channel differential transistor having a gate receiving the VIPP input, and having a source connected to a power supply and a drain connected to a true upper node;
a complement p-channel differential transistor having a gate receiving the VIPN input, and having a source connected to the power supply and a drain connected to a complement upper node;
a true p-channel cascode transistor having a source connected to the true upper node, and a drain connected to a VON output;
a complement p-channel cascode transistor having a source connected to the complement upper node, and a drain connected to a VOP output;
a true n-channel differential transistor having a gate receiving the VINP input, and having a source connected to a ground and a drain connected to a true lower node;
a complement n-channel differential transistor having a gate receiving the VINN input, and having a source connected to the ground and a drain connected to a complement lower node;
a true n-channel cascode transistor having a source connected to the true lower node, and a drain connected to the VON output;
a complement n-channel cascode transistor having a source connected to the complement lower node, and a drain connected to the VOP output;
wherein the VOP output and the VON output form a differential output;
wherein the voltage shifter comprises an AC-coupled input network that comprises:
a true upper capacitor connected between the VIP input and the VIPP input;
a true upper switch that closes to connect an upper shift voltage to the true upper capacitor during a zeroing phase of the differential residue amplifier;
a complement upper capacitor connected between the VIN input and the VIPN input;
a complement upper switch that closes to connect the upper shift voltage to the complement upper capacitor during the zeroing phase of the differential residue amplifier;
a true lower capacitor connected between the VIP input and the VINP input;
a true lower switch that closes to connect a lower shift voltage to the true lower capacitor during the zeroing phase of the differential residue amplifier;
a complement lower capacitor connected between the VIN input and the VINN input;
a complement lower switch that closes to connect the lower shift voltage to the complement lower capacitor during the zeroing phase of the differential residue amplifier;

an input equalizing switch that closes to connect the VIP input to the VIN input during the zeroing phase of the differential residue amplifier;

wherein the upper shift voltage is higher in voltage that the lower shift voltage; and a Switched-Capacitor Common-Mode Feedback (SCCMFB) circuit receiving an input bias voltage and receiving a common-mode voltage and generating an output bias voltage, the SCCMFB circuit comprising a ping circuit comprising:

a first true capacitor connected between the VOP output and the output bias voltage;

a first true staging capacitor;

a first load switch that connects a first terminal of the first true staging capacitor with the common-mode voltage during the a phase;

a second load switch that connects a second terminal of the first true staging capacitor with the input bias voltage during the first phase;

a third load switch that connects the first terminal of the first true staging capacitor to the VOP output during a second phase;

a fourth load switch that connects the second terminal of the first true staging capacitor to the output bias voltage during the second phase;

a first complement capacitor connected between the VON output and the output bias voltage;

a first complement staging capacitor;

a fifth load switch that connects a first terminal of the first complement staging capacitor with the common-mode voltage during the first phase;

a sixth load switch that connects a second terminal of the first complement staging capacitor with the input bias voltage during the first phase;

a seventh load switch that connects the first terminal of the first complement staging capacitor to the VOP output during the second phase;

an eighth load switch that connects the second terminal of the first complement staging capacitor to the output bias voltage during the second phase;

a pong circuit that comprises the ping circuit wherein the first phase and the second phase are swapped;

wherein a first instance of the SCCMFB circuit is an upper SCCMFB circuit that receives an upper bias voltage as the input bias voltage and generates the upper shift voltage as the output bias voltage;

wherein a second instance of the SCCMFB circuit is a lower SCCMFB circuit that receives a lower bias voltage as the input bias voltage and generates the lower shift voltage as the output bias voltage;

wherein the upper bias voltage is higher voltage that the lower bias voltage.

7. The differential residue amplifier of claim 6 wherein a gate of the true p-channel cascode transistor and a gate of the complement p-channel cascode transistor receive an upper bias voltage;

wherein a gate of the true n-channel cascode transistor and a gate of the complement n-channel cascode transistor receive a lower bias voltage;

wherein the upper bias voltage is higher in voltage than the lower bias voltage.

8. The differential residue amplifier of claim 6 further comprising:

an upper differential amplifier having a first input connected to the true upper node and having a second input connected to the complement upper node, the upper differential amplifier generating a first output driving a gate of the complement p-channel cascode transistor, and generating a second output driving a gate of the true p-channel cascode transistor;

a lower differential amplifier having a first input connected to the true lower node and having a second input connected to the complement lower node, the lower differential amplifier generating a first output driving a gate of the complement n-channel cascode transistor, and generating a second output driving a gate of the true n-channel cascode transistor;

wherein gain boosting is provided.

9. A differential residue amplifier comprising:

a differential input having a VIP input and a VIN input wherein VIP and VIN are complementary;

a voltage shifter, receiving the differential input, for generating an upper differential input having a VIPN input and a VIPP input, and for generating a lower differential input having a VINP input and a VINN input, the voltage shifter shifting upward a common-mode voltage of the differential input to generate the upper differential input, the voltage shifter shifting downward the common-mode voltage of the differential input to generate the lower differential input;

a true p-channel differential transistor having a gate receiving the VIPP input, and having a source connected to a power supply and a drain connected to a true upper node;

a complement p-channel differential transistor having a gate receiving the VIPN input, and having a source connected to the power supply and a drain connected to a complement upper node;

a true p-channel cascode transistor having a source connected to the true upper node, and a drain connected to a VON output;

a complement p-channel cascode transistor having a source connected to the complement upper node, and a drain connected to a VOP output;

a true n-channel differential transistor having a gate receiving the VINP input, and having a source connected to a ground and a drain connected to a true lower node;

a complement n-channel differential transistor having a gate receiving the VINN input, and having a source connected to the ground and a drain connected to a complement lower nodes;

a true n-channel cascode transistor having a source connected to the true lower node, and a drain connected to the VON output;

a complement n-channel cascode transistor having a source connected to the complement lower node, and a drain connected to the VOP output;

wherein the VOP output and the VON output form a differential output;

a first ADC stage that converts an analog input into a first M digital bits that represent an analog value of the analog input, wherein M is a whole number of at least 3, the first ADC stage outputting a residue after quantization of the analog input to the first M digital bits;

the differential residue amplifier receiving the residue from the first ADC stage as the differential input and generating the differential output;

a pair of feedback capacitors connected between the differential input and the differential output of the residue amplifier; and a second ADC stage that converts the differential output from the residue amplifier into a second N digital bits that represent an analog value of the differential output from the residue amplifier, wherein N is a whole number of at least 5.

10. The differential residue amplifier of claim 9 wherein the voltage shifter comprises an AC-coupled input network that comprises:
- a true upper capacitor connected between the VIP input and the VIPP input;
- a true upper switch that closes to connect an upper shift voltage to the true upper capacitor during a zeroing phase of the differential residue amplifier;
- a complement upper capacitor connected between the VIN input and the VIPN input;
- a complement upper switch that closes to connect the upper shift voltage to the complement upper capacitor during the zeroing phase of the differential residue amplifier;
- a true lower capacitor connected between the VIP input and the VINP input;
- a true lower switch that closes to connect a lower shift voltage to the true lower capacitor during the zeroing phase of the differential residue amplifier;
- a complement lower capacitor connected between the VIN input and the VINN input;
- a complement lower switch that closes to connect the lower shift voltage to the complement lower capacitor during the zeroing phase of the differential residue amplifier;
- an input equalizing switch that closes to connect the VIP input to the VIN input during the zeroing phase of the differential residue amplifier;

wherein the upper shift voltage is higher in voltage than the lower shift voltage.

* * * * *